(12) United States Patent
Dennison

(10) Patent No.: US 7,491,574 B2
(45) Date of Patent: Feb. 17, 2009

(54) REDUCING OXIDATION OF PHASE CHANGE MEMORY ELECTRODES

(75) Inventor: Charles H. Dennison, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/904,557

(22) Filed: Sep. 27, 2007

(65) Prior Publication Data

US 2008/0020508 A1 Jan. 24, 2008

Related U.S. Application Data

(62) Division of application No. 11/168,780, filed on Jun. 28, 2005.

(51) Int. Cl.
*H01L 21/06* (2006.01)

(52) U.S. Cl. ..................................... 438/102; 438/95

(58) Field of Classification Search .............. 438/102, 438/95, 98, 131, 132; 257/368, 214, 298, 257/3–5, 528–530, E45.002, E27.004; 427/255.29–255.36
See application file for complete search history.

(56) References Cited

U.S. PATENT DOCUMENTS

| | | | | |
|---|---|---|---|---|
| 2004/0114413 | A1* | 6/2004 | Parkinson et al. | 365/100 |
| 2004/0115860 | A1* | 6/2004 | Johnson et al. | 438/102 |
| 2005/0263823 | A1* | 12/2005 | Hwang et al. | 257/368 |
| 2006/0035403 | A1* | 2/2006 | Campbell | 438/95 |

* cited by examiner

*Primary Examiner*—Steven Loke
*Assistant Examiner*—Tram H Nguyen
(74) *Attorney, Agent, or Firm*—Trop, Pruner & Hu, P.C.

(57) ABSTRACT

A phase change memory may be formed in a way which reduces oxygen infiltration through a chalcogenide layer overlying a lower electrode. Such infiltration may cause oxidation of the lower electrode which adversely affects performance. In one such embodiment, an etch through an overlying upper electrode layer may be stopped before reaching a layer which overlies said chalcogenide layer. Then, photoresist used for such etching may be utilized in a high temperature oxygen plasma. Only after such plasma treatment has been completed is that overlying layer removed, which ultimately exposes the chalcogenide.

4 Claims, 4 Drawing Sheets

REDUCING OXIDATION OF PHASE CHANGE MEMORY ELECTRODES

CROSS-REFERENCE TO RELATED APPLICATIONS

This application is a divisional of U.S. patent application Ser. No. 11/168,780, filed Jun. 28, 2005.

BACKGROUND

This invention relates generally to phase change memory devices.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

During the fabrication of phase change memories, electrodes within a memory cell may oxidize, leading to significant resistance increases. These increases may result in defective products. The number of cells in memories failing the high resistance tests may be reduced by taking great care in the processing steps and step sequences to minimize any opportunity for oxidation. However, such steps add to the cost of manufacturing the products and may not always be completely effective.

Thus, there is a need for better ways to reduce the resistance increase, product failures, or other adverse consequences of electrode oxidation in phase change memories.

DETAILED DESCRIPTION

In accordance with some embodiments of the present invention, oxygen infiltration may be reduced. Oxygen infiltration causes oxidation of the lower electrode, adversely affecting the performance of phase change memories. One modality for such oxidation is for oxygen to diffuse through a chalcogenide layer overlying the lower electrode. When that oxygen diffuses through and reaches the lower electrode it causes oxidation of that oxidizable lower electrode. To prevent such infiltration, a barrier layer may be utilized in one embodiment of the present invention, which is applied under appropriate circumstances to facilitate other process steps while still protecting the lower electrode, in some embodiments.

In one embodiment, memory elements may comprise a phase change material. In this embodiment, the memory may be referred to as a phase change memory. A phase change material may be a material having electrical properties (e.g. resistance, capacitance, etc.) that may be changed through the application of energy such as, for example, heat, light, voltage potential, or electrical current. The phase change material may include a chalcogenide material.

A chalcogenide alloy may be used in a memory element or in an electronic switch. A chalcogenide material may be a material that includes at least one element from column VI of the periodic table or may be a material that includes one or more of the chalcogen elements, e.g., any of the elements of tellurium, sulfur, or selenium.

Figure 1:
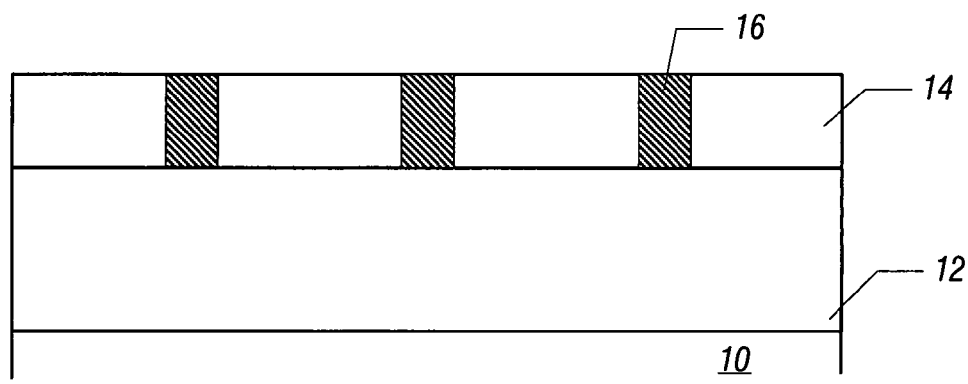
FIG. 1 is an enlarged, cross-sectional view at an early stage of manufacture in accordance with one embodiment of the present invention.

Referring to FIG. 1, in accordance with one embodiment of the present invention, a planar insulator 10, such as an interlayer dielectric, may be overlaid by a row line conductor 12. The row line conductor 12 may be chemical vapor deposited titanium silicon nitride. In one embodiment, the row line conductor may be about 2500 Angstroms in thickness. Overlying the row line conductor 12 may be a planar insulator 14. In one embodiment, the insulator 14 is blanket deposited, patterned, and etched to form openings which are filled by the resistive plugs 16. These resistive plugs 16 constitute the lower electrode of a phase change memory cell. In other words, each plug 16 may be used as the lower electrode of a different phase change memory cell. The lower electrodes may be made of material which is oxidizable such as chemical vapor deposited titanium silicon nitride.

Figure 2:
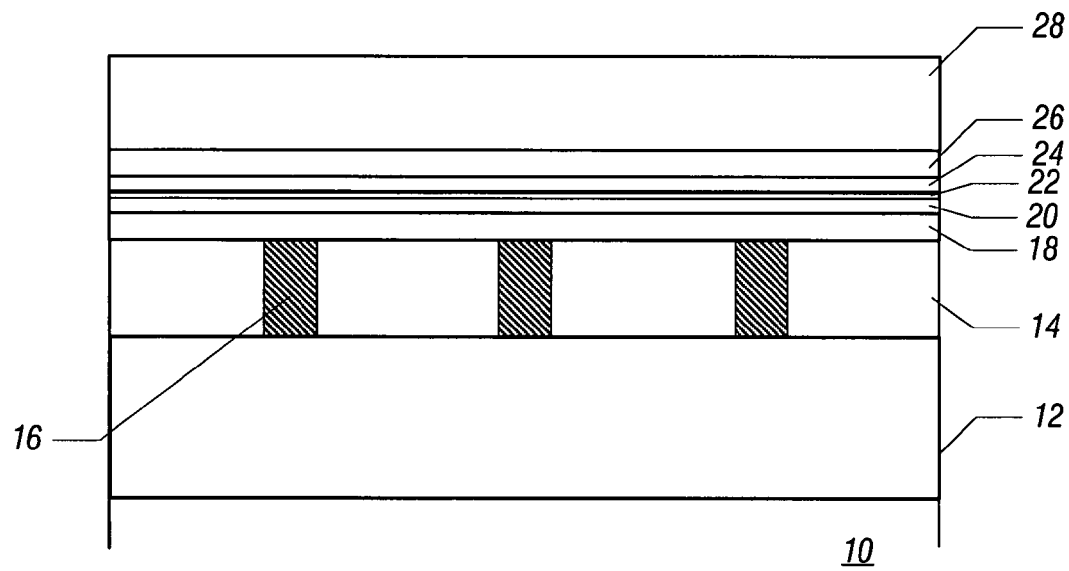
FIG. 2 is an enlarged, cross-sectional view at a subsequent stage in accordance with one embodiment of the present invention.

Referring to FIG. 2, a stack of layers may be deposited to form a phase change memory cell and/or a select device which, in one embodiment, may be an ovonic threshold switch. Initially, the phase change memory material or chalcogenide 18 may be deposited, for example, to a thickness of 500 Angstroms. Then, a top electrode 20 may be deposited, for example, to a thickness of 300 Angstroms. The top electrode may be TiAlN (titanium aluminum nitride) or a composite film of Ti/TiN (titanium/titanium nitride) in one embodiment. Next, in some embodiments, a barrier film 22 may be formed. The barrier film may be up to 100 Angstroms in thickness in some cases.

In an embodiment using an ovonic threshold switch, an ovonic threshold switch lower electrode 24 may be deposited. In one embodiment, the lower electrode 24 may be formed of carbon and may be 300 Angstroms thick. Next, the ovonic threshold switch material 26 may be deposited. It may be a chalcogenide which is 500 Angstroms thick in one embodiment. It may be formed of a material which does not change phase. Finally, an upper electrode 28 may be deposited. It may be formed of TiAlN or a composite film of Ti/TiN, titanium, or titanium nitride in some embodiments. For example, it may be between 50 and 2000 Angstroms thick.

Figure 3:
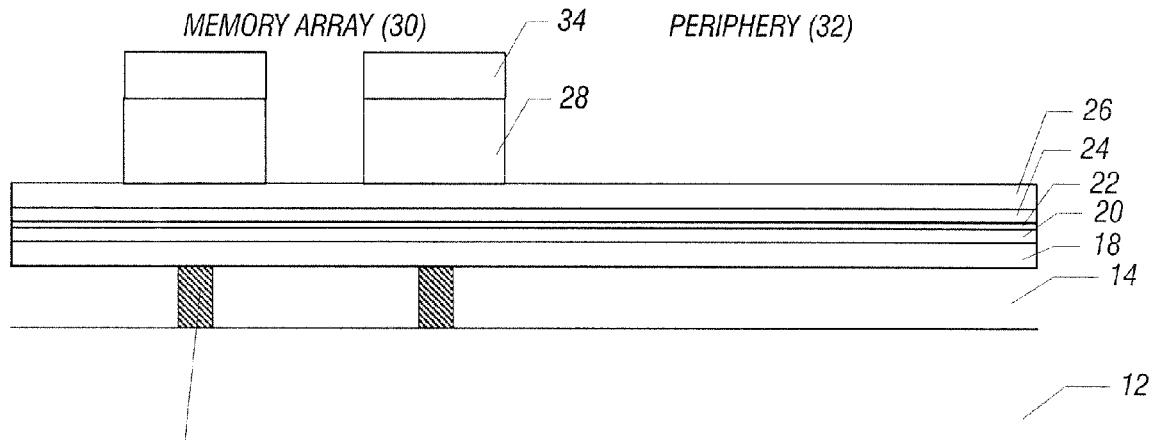
FIG. 3 is an enlarged, cross-sectional view at a subsequent stage in accordance with one embodiment of the present invention.

Referring to FIG. 3, (showing only a portion of the structure shown in FIG. 2) the structure shown in FIG. 2 may be patterned and etched to form a large number of memory array cells, although only two are shown in FIG. 3. In one embodiment, the cells may be defined by a patterned hard mask 34 which is applied over the upper electrode 28. Next, the upper electrode 28 is etched, using the pre-patterned hard mask 34 as a mask in some embodiments. The etch proceeds down to the uppermost layer which, in the embodiment illustrated in FIG. 3, is the ovonic threshold switch material 26. By etching only partially and stopping at the layer 26, exposure of the lower chalcogenide 18 at this stage to an oxidizing environment to remove a photoresist pattern that was utilized to patterned the memory array cells is prevented.

Moreover, photoresist used in patterning and etching may be removed using an oxygen plasma with the chalcogenide 18 protected by the overlying layers 20-26. Therefore, oxygen infiltration through the layer 18 to the lower electrode 16 is reduced or eliminated to this stage.

In some embodiments, processing steps may be done in low oxygen atmospheres in order to prevent oxygen infiltration which may adversely affect the lower electrodes 16. For example, in-process wafers can be stored in a nitrogen environment prior to processing. In some embodiments, resist stripping may be done in a process which does not use a high temperature oxygen plasma step but, rather, is done in a wet bath and/or only a low temperature oxygen plasma resist strip is utilized.

Figure 4:
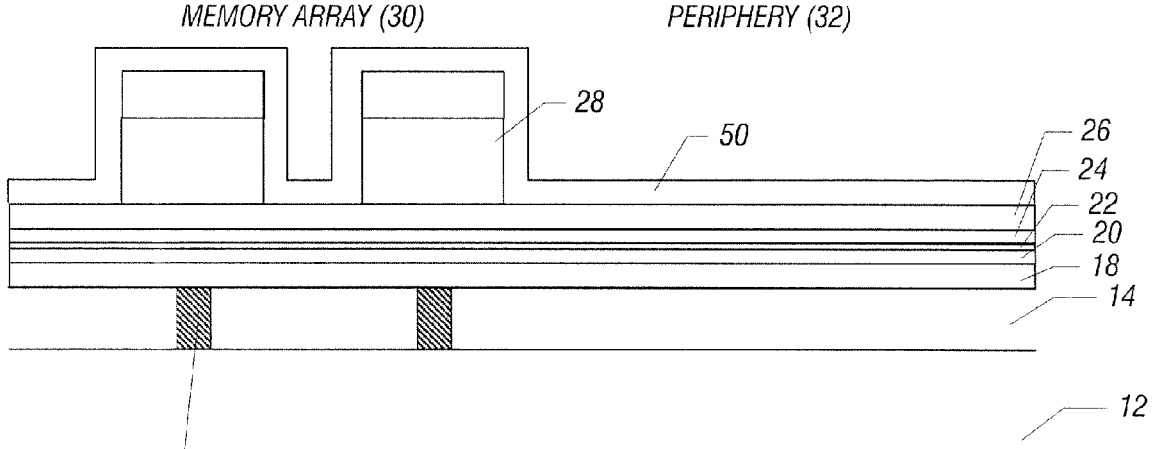
FIG. 4 is an enlarged, cross-sectional view at a subsequent stage in accordance with one embodiment of the present invention.
Figure 5:
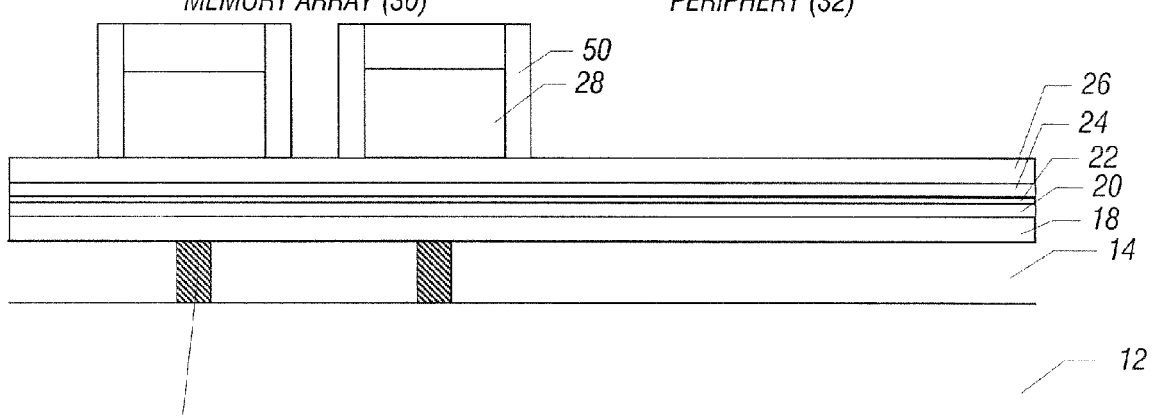
FIG. 5 is an enlarged, cross-sectional view at a subsequent stage in accordance with one embodiment of the present invention.

In some embodiments of the present invention, sidewall spacer layer 50 may be applied, as shown in FIG. 4. The sidewall spacer layer 50 may be anisotropically etched as indicated in FIG. 5.

Figure 6:
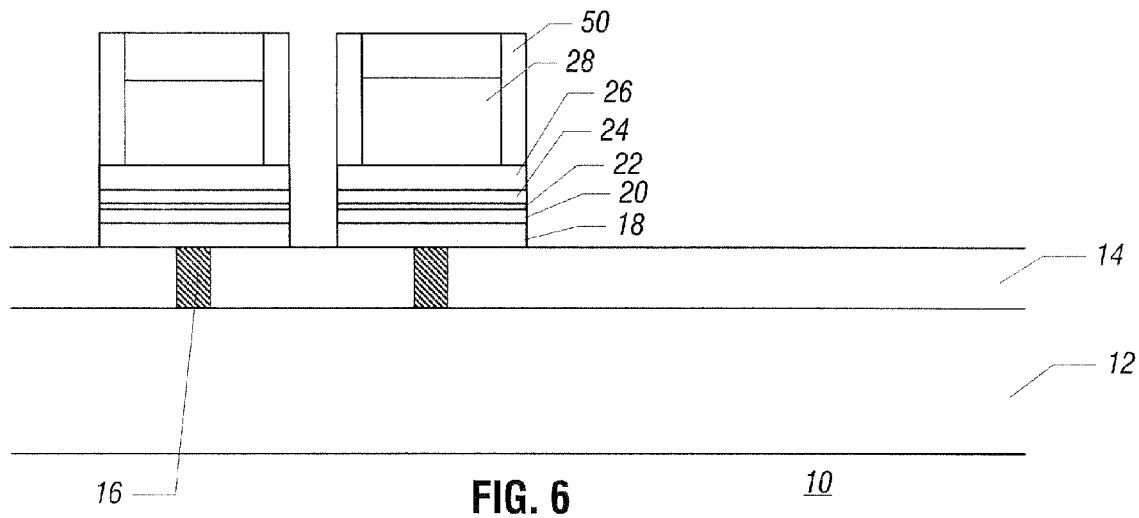
FIG. 6 is an enlarged, cross-sectional view at a subsequent stage in accordance with one embodiment of the present invention.

Then, as shown in FIG. 6, the cells may be singularized by patterning and etching down to the insulator 14. Thus, the width of the etched stack over the lower electrode 16 is increased by virtue of the provision of the sidewall spacers 50 in some embodiments.

Figure 7:
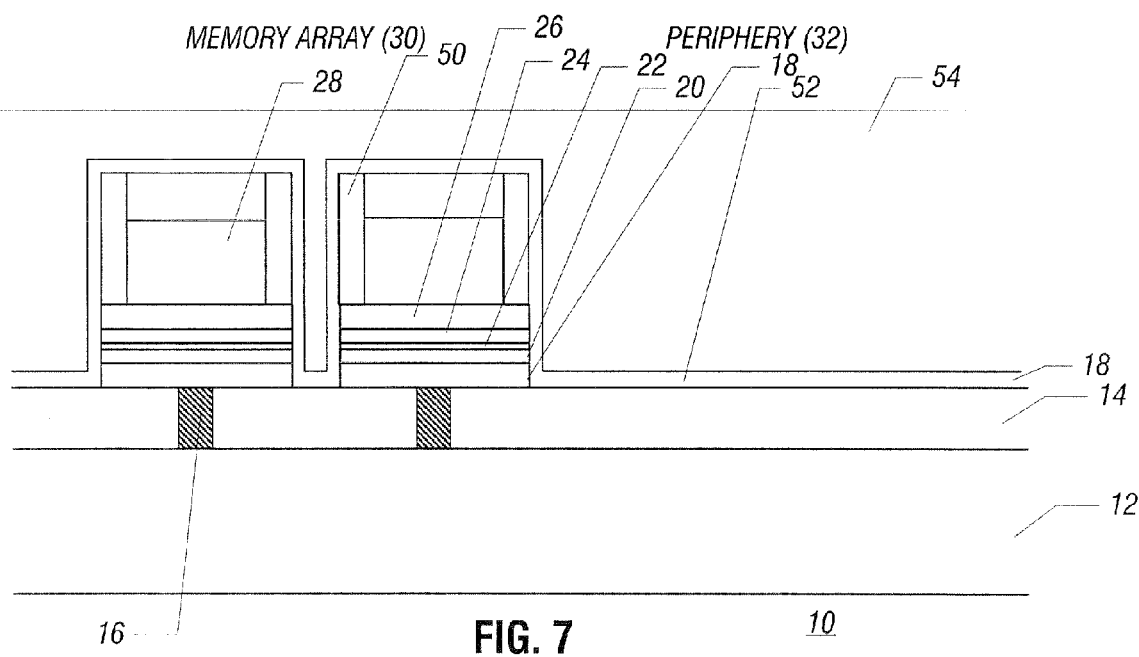
FIG. 7 is an enlarged, cross-sectional view at a subsequent stage in accordance with one embodiment of the present invention.

Finally, as shown in FIG. 7, an oxidation barrier 52 may be blanket deposited. As examples, the oxidation barrier 52 may be silicon nitride, $S_iO_xN_y$, $AL_2O_3$ (aluminum oxide), or other materials of sufficient thickness to prevent oxygen infiltration through the chalcogenide 18 that would adversely affect the lower electrode 16. Similarly, it may be appreciated that the wider width of the stacks may also reduce oxygen infiltration since defused oxygen must pass through a longer thickness of chalcogenide 18 to reach the lower electrode 16.

In some embodiments, wafers may be directly transferred to an oxygen barrier deposition tool while still under vacuum from the etch chamber. For example, this may be done in the same cluster tool. As another example, the wafer may be loaded into a pod that is either under vacuum or purged with argon or nitrogen.

In some embodiments, silicon nitride may be deposited by plasma enhanced chemical vapor deposition. Silicon nitride may also be formed by atomic layer deposition. Likewise, aluminum oxide may be formed by atomic layer deposition.

Thus, it may be appreciated that, in some embodiments, the lower electrode 16 is only exposed to oxygen infiltration after an oxidation barrier has been completed.

After applying the oxidation barrier 52, an overlying oxide 54, such as a high deposition pressure (HDP) oxide, is applied in some embodiments. An HDP oxide 54 application would normally cause oxidation of the lower electrode if the chalcogenide 18 were not already protected by the oxidation barrier 52.

A series connected select device, including the switch material 26, may be used to access a memory element, including the chalcogenide 18, during programming or reading of memory element. A select device may be an ovonic threshold switch that can be made of a chalcogenide alloy that does not exhibit an amorphous to crystalline phase change and which undergoes rapid, electric field initiated change in electrical conductivity that persists only so long as a holding voltage is present.

A select device may operate as a switch that is either "off" or "on" depending on the amount of voltage potential applied across the memory cell, and more particularly whether the current through the select device exceeds its threshold current or voltage, which then triggers the device into the on state. The off state may be a substantially electrically nonconductive state and the on state may be a substantially conductive state, with less resistance than the off state.

In the on state, the voltage across the select device is equal to its holding voltage $V_H$ plus IxRon, where Ron is the dynamic resistance from the extrapolated X-axis intercept, $V_H$. For example, a select device may have threshold voltages and, if a voltage potential less than the threshold voltage of a select device is applied across the select device, then the select device may remain "off" or in a relatively high resistive state so that little or no electrical current passes through the memory cell and most of the voltage drop from selected row to selected column is across the select device. Alternatively, if a voltage potential greater than the threshold voltage of a select device is applied across the select device, then the select device may "turn on," i.e., operate in a relatively low resistive state so that electrical current passes through the memory cell. In other words, one or more series connected select devices may be in a substantially electrically nonconductive state if less than a predetermined voltage potential, e.g., the threshold voltage, is applied across select devices. Select devices may be in a substantially conductive state if greater than the predetermined voltage potential is applied across select devices. Select devices may also be referred to as an access device, an isolation device, or a switch.

In one embodiment, each select device may comprise a switching material such as, for example, a chalcogenide alloy, and may be referred to as an ovonic threshold switch, or simply an ovonic switch. The switching material of select devices may be a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with $V_H$) by application of a predetermined electrical current or voltage potential. In this embodiment, each select device may be a two terminal device that may have a current-voltage (I-V) characteristic similar to a phase change memory element that is in the amorphous state. However, unlike a phase change memory element, the switching material of select devices may not change phase. That is, the switching material of select devices may not be a programmable material, and, as a result, select devices may not be a memory device capable of storing information. For example, the switching material of select devices may remain permanently amorphous and the I-V characteristic may remain the same throughout the operating life.

In the low voltage or low electric field mode, i.e., where the voltage applied across select device is less than a threshold voltage (labeled $V_{TH}$), a select device may be "off" or nonconducting, and exhibit a relatively high resistance, e.g., greater than about 10 megaOhms. The select device may remain in the off state until a sufficient voltage, e.g., $V_{TH}$, is applied, or a sufficient current is applied, e.g., $I_{TH}$, that may switch the select device to a conductive, relatively low resistance on state. After a voltage potential of greater than about $V_{TH}$ is applied across the select device, the voltage potential across the select device may drop ("snapback") to a holding voltage potential, $V_H$. Snapback may refer to the voltage difference between $V_{TH}$ and $V_H$ of a select device.

In the on state, the voltage potential across select device may remain close to the holding voltage of $V_H$ as current passing through select device is increased. The select device may remain on until the current through the select device drops below a holding current, $I_H$. Below this value, the select device may turn off and return to a relatively high resistance, nonconductive off state until the $V_{TH}$ and $I_{TH}$ are exceeded again.

In some embodiments, only one select device may be used. In other embodiments, more than two select devices may be used. A single select device may have a $V_H$ about equal to its threshold voltage, $V_{TH}$, (a voltage difference less than the threshold voltage of the memory element) to avoid triggering a reset bit when the select device triggers from a threshold voltage to a lower holding voltage called the snapback voltage. An another example, the threshold current of the memory element may be about equal to the threshold current of the access device even though its snapback voltage is greater than the memory element's reset bit threshold voltage.

One or more MOS or bipolar transistors or one or more diodes (either MOS or bipolar) may be used as the select device. If a diode is used, the bit may be selected by lowering the row line from a higher deselect level. As a further non-limiting example, if an n-channel MOS transistor is used as a select device with its source, for example, at ground, the row line may be raised to select the memory element connected between the drain of the MOS transistor and the column line. When a single MOS or single bipolar transistor is used as the select device, a control voltage level may be used on a "row line" to turn the select device on and off to access the memory element.

Programming of the chalcogenide 18 to alter the state or phase of the material may be accomplished by applying voltage potentials to the lower electrode 16 and upper electrode 28, thereby generating a voltage potential across the select device and memory element. When the voltage potential is greater than the threshold voltages of select device and memory element, then an electrical current may flow through the chalcogenide 18 in response to the applied voltage potentials, and may result in heating of the chalcogenide 18.

This heating may alter the memory state or phase of the chalcogenide 18. Altering the phase or state of the chalcogenide 18 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 8:
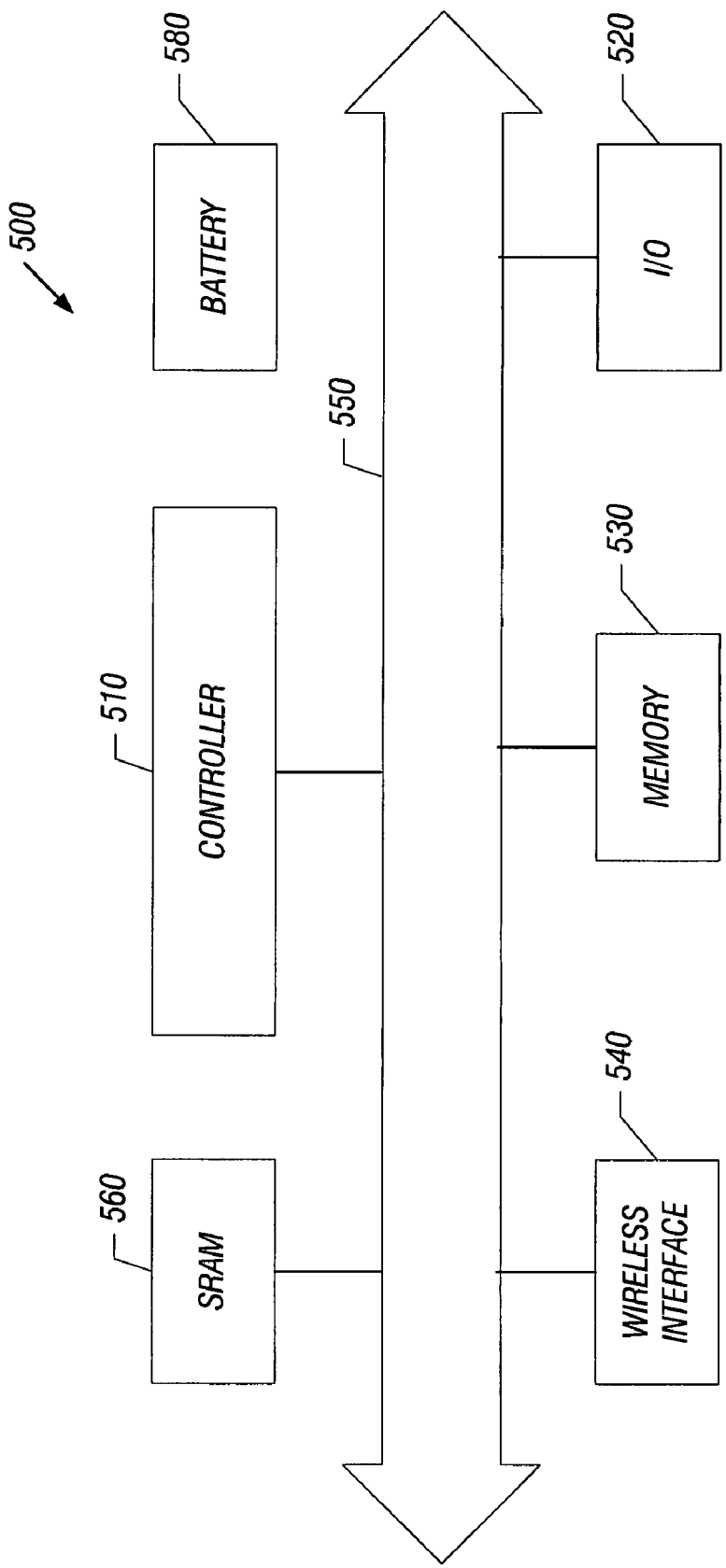
FIG. 8 is a system depiction of one embodiment of the present invention.

Turning to FIG. 8, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
forming a stack including an upper electrode, a lower electrode, and a chalcogenide layer over the lower electrode;
using photoresist to pattern and etch said upper electrode; stopping said etching before reaching said chalcogenide layer to leave a layer covering said chalcogenide layer; and
reducing oxygen exposure of said chalcogenide layer to reduce oxidation of said lower electrode by removing the photoresist before etching the layer covering said chalcogenide.

2. The method of claim 1, including refraining from using a high temperature oxygen plasma treatment to remove said photoresist.

3. The method of claim 1, wherein said stack further including: forming an ovonic threshold switch, and said etching through said upper electrode down to said ovonic threshold switch.

4. The method of claim 3, including applying an oxidation barrier layer after etching through said chalcogenide layer.

* * * * *